US012211824B2

(12) United States Patent
Nikitin et al.

(10) Patent No.: US 12,211,824 B2
(45) Date of Patent: Jan. 28, 2025

(54) POWER SEMICONDUCTOR PACKAGE HAVING FIRST AND SECOND LEAD FRAMES

(71) Applicant: Infineon Technologies AG, Neubiberg (DE)

(72) Inventors: Ivan Nikitin, Regensburg (DE); Thorsten Scharf, Lappersdorf (DE); Marco Bäßler, Oeversee (DE); Andreas Grassmann, Regensburg (DE); Waldemar Jakobi, Soest (DE)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 18/130,952

(22) Filed: Apr. 5, 2023

(65) Prior Publication Data

US 2023/0361088 A1   Nov. 9, 2023

Related U.S. Application Data

(63) Continuation of application No. 17/736,519, filed on May 4, 2022.

(51) Int. Cl.
*H01L 25/07* (2006.01)
*H01L 23/495* (2006.01)
(Continued)

(52) U.S. Cl.
CPC ........ *H01L 25/072* (2013.01); *H01L 23/4952* (2013.01); *H01L 23/49537* (2013.01);
(Continued)

(58) Field of Classification Search
CPC .......... H01L 23/4952; H01L 23/49532; H01L 23/49525; H01L 23/49575;
(Continued)

(56) References Cited

U.S. PATENT DOCUMENTS 6,867,072 B1 *  3/2005  Shiu ................... H01L 23/3107
                                                      257/E23.033
8,531,067 B2     9/2013  Tunzini et al.
(Continued)

FOREIGN PATENT DOCUMENTS

CN          105703631 A    6/2016
CN          215578506 U    1/2022
DE        102020208438 A1  1/2022

*Primary Examiner* — Nathan W Ha
(74) *Attorney, Agent, or Firm* — Murphy, Bilak & Homiller, PLLC

(57) ABSTRACT

A power semiconductor package includes first power semiconductor dies attached to a metallization layer of at least one first power electronics carrier and second power semiconductor dies attached to a metallization layer of at least one second power electronics carrier. A first lead frame includes a first structured metal frame electrically connected to a load terminal of each first power semiconductor die, and a second structured metal frame electrically connected to a load terminal of each second power semiconductor die and to the metallization layer of the first power electronics carrier. A second lead frame above the first lead frame includes first and second leads electrically connected to the metallization layer of the second power electronics carrier, a third lead between the first and second leads and electrically connected to the first structured metal frame, and a fourth lead electrically connected to the second structured metal frame.

15 Claims, 8 Drawing Sheets

(51) Int. Cl.
*H01L 23/498* (2006.01)
*H01L 23/00* (2006.01)
*H01L 23/31* (2006.01)

(52) U.S. Cl.
CPC .. *H01L 23/49575* (2013.01); *H01L 23/49811* (2013.01); *H01L 23/49833* (2013.01); *H01L 23/3121* (2013.01); *H01L 24/48* (2013.01); *H01L 24/49* (2013.01); *H01L 2224/48245* (2013.01); *H01L 2224/49175* (2013.01)

(58) Field of Classification Search
CPC ........... H01L 23/49533; H01L 23/3121; H01L 25/072; H01L 24/48; H01L 24/49
See application file for complete search history.

(56) References Cited

U.S. PATENT DOCUMENTS

| | | | |
|---|---|---|---|
| 9,368,434 | B2 | 6/2016 | Otremba |
| 9,736,925 | B2 | 8/2017 | Ziglioli |
| 9,818,677 | B2 | 11/2017 | Liu et al. |
| 10,403,601 | B2 | 9/2019 | Im et al. |
| 11,037,856 | B2 | 6/2021 | Neugirg et al. |
| 11,075,137 | B2 | 7/2021 | Lin et al. |
| 2012/0256194 | A1 | 10/2012 | Yoshihara et al. |
| 2014/0091449 | A1* | 4/2014 | Fernando .......... H01L 23/49575 257/676 |
| 2017/0025335 | A1* | 1/2017 | Liu ................... H01L 23/49524 |
| 2018/0218960 | A1 | 8/2018 | Takahagi et al. |
| 2018/0329002 | A1* | 11/2018 | Lorenz ................. G01R 15/205 |
| 2019/0304946 | A1* | 10/2019 | Cottet ................... H01L 23/645 |
| 2020/0266135 | A1* | 8/2020 | Yano ....................... H01L 24/40 |
| 2020/0273781 | A1 | 8/2020 | Scharf et al. |
| 2021/0020604 | A1 | 1/2021 | Nakamura |
| 2021/0313296 | A1 | 10/2021 | Raimann et al. |
| 2021/0344276 | A1 | 11/2021 | Raimann et al. |
| 2021/0358835 | A1 | 11/2021 | Inokuchi |
| 2022/0005755 | A1 | 1/2022 | Scharf et al. |
| 2022/0115246 | A1 | 4/2022 | Higashi et al. |
| 2022/0115351 | A1 | 4/2022 | Yoshihara |
| 2022/0208654 | A1 | 6/2022 | Baek et al. |
| 2022/0208685 | A1 | 6/2022 | Takahashi et al. |
| 2022/0238413 | A1 | 7/2022 | Grassmann |
| 2022/0301955 | A1 | 9/2022 | Kaneko |
| 2022/0301993 | A1 | 9/2022 | Kimura et al. |
| 2022/0301997 | A1 | 9/2022 | Miyakoshi |
| 2022/0399241 | A1 | 12/2022 | Itoh |
| 2022/0406745 | A1 | 12/2022 | Pavlicek et al. |
| 2023/0052830 | A1 | 2/2023 | Prajuckamol et al. |
| 2023/0060830 | A1 | 3/2023 | Kim et al. |
| 2023/0067156 | A1 | 3/2023 | Yamada |
| 2023/0077964 | A1 | 3/2023 | Yoshihara et al. |
| 2023/0084150 | A1 | 3/2023 | Nakazawa |
| 2023/0135461 | A1 | 5/2023 | Aoki et al. |
| 2023/0178461 | A1 | 6/2023 | Hama et al. |
| 2023/0207431 | A1 | 6/2023 | Yanagida et al. |
| 2023/0335460 | A1 | 10/2023 | Sato |
| 2023/0361088 | A1 | 11/2023 | Nikitin et al. |
| 2023/0411254 | A1 | 12/2023 | Nikitin et al. |
| 2024/0071851 | A1 | 2/2024 | Tremlett et al. |
| 2024/0071892 | A1 | 2/2024 | Kim et al. |
| 2024/0079297 | A1 | 3/2024 | Luniewski et al. |
| 2024/0087995 | A1 | 3/2024 | Otremba et al. |

* cited by examiner

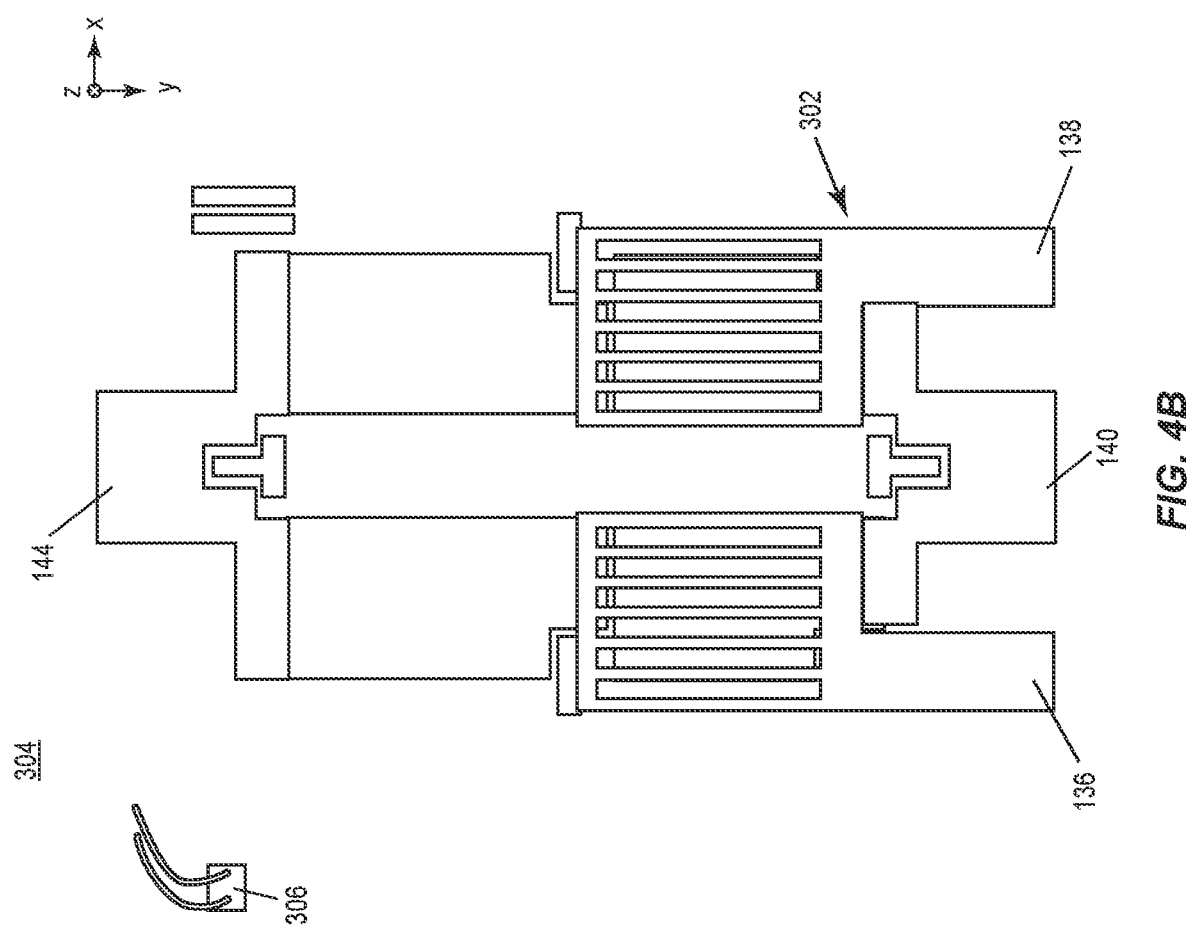
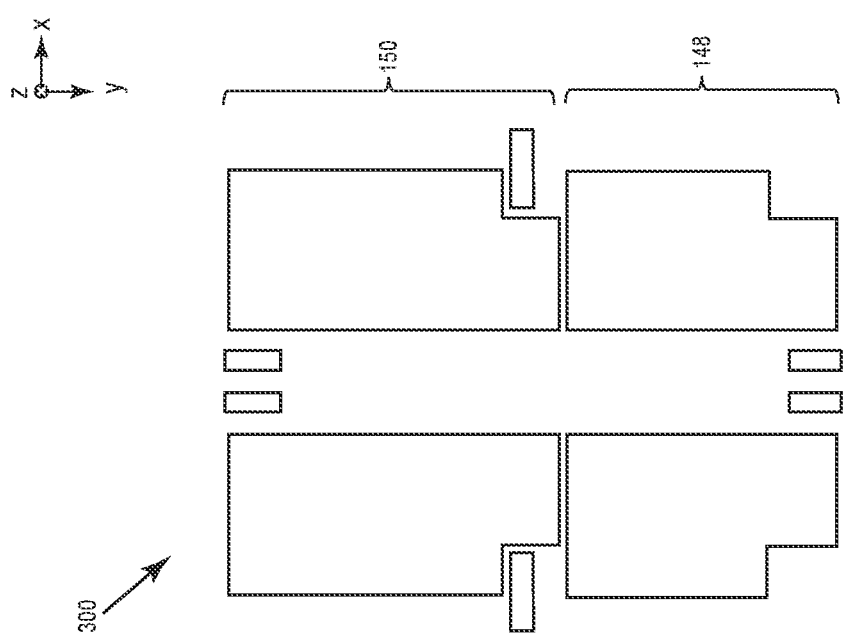
FIG. 4B
FIG. 4A

POWER SEMICONDUCTOR PACKAGE HAVING FIRST AND SECOND LEAD FRAMES

BACKGROUND

Symmetrical switching of multiple power SiC dies (chips) enables high power applications for 1200V and up to 580 A or more. Conventional molded power semiconductor package designs provide a symmetrical connection for the high-side and low-side switching node connection but the gate contacts for the high side and low side are not symmetrical, which results in different maximal possible switching speeds for the high side and low side. This can lead to oscillations at increased frequencies which can destroy the modules due to high inductive connection of the gate contacts, unless a strong derating is applied for the application.

Hence, there is a need form an improved molded power semiconductor package design suitable for high power applications for 1200V and up to 580 A or more.

SUMMARY

According to an embodiment of a molded power semiconductor package, the molded power semiconductor package comprises: at least one first power electronics carrier comprising a metallization layer disposed on an electrically insulating substrate; a plurality of first power semiconductor dies attached to the metallization layer of the at least one first power electronics carrier; at least one second power electronics carrier comprising a metallization layer disposed on an electrically insulating substrate; a plurality of second power semiconductor dies attached to the metallization layer of the at least one second power electronics carrier; and a mold compound encasing the plurality of first power semiconductor dies and the plurality of second power semiconductor dies, and at least partly encasing the at least one first power electronics carrier and the at least one second power electronics carrier, wherein the at least one first power electronics carrier and the at least one second power electronics carrier lie in a same plane.

According to another embodiment of a molded power semiconductor package, the molded power semiconductor package comprises: a mold compound; a plurality of first power semiconductor dies embedded in the mold compound; a plurality of second power semiconductor dies embedded in the mold compound and electrically connected to the plurality of first power semiconductor dies to form a half bridge; a first structured metal frame disposed above the plurality of first power semiconductor dies and electrically connected to a load terminal of each power semiconductor die of the plurality of first power semiconductor dies; a second structured metal frame disposed above the plurality of first power semiconductor dies and electrically connected to a load terminal of each power semiconductor die of the plurality of second power semiconductor dies, wherein both the first structured metal frame and the second structured metal frame are symmetric about a longitudinal centerline of the molded power semiconductor package.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4A and 4B illustrate top plan views of an embodiment of producing the connection frame with different thicknesses.

DETAILED DESCRIPTION

The embodiments described herein provide a molded power semiconductor package having a connection frame that overlies the power semiconductor dies included in the package and which provides power and gate connections to the power semiconductor dies. A first group of the power semiconductor dies may form a low-side switch of a half-bridge and a second group of the power semiconductor dies may form a high-side switch of the half-bridge. The high-side and low-side power semiconductor dies are mounted to the metallized surface of separate insulative substrates to reduce stray inductance. The connection frame that provides power and gate connections to the power semiconductor dies may have a uniform thickness or regions of different thicknesses to further reduce stray inductances, enabling even higher switching speeds. Further structural features are described for reducing the stray inductance of the connection frame.

A gate contact structure inside the molded power semiconductor package extends along the centerline of the molded power semiconductor package. The gate contact structure may be part of a metal clip frame, a PCB (printed circuit board), an insulative substrate having a metallized surface, or as an additional metal strip insulated from the connection frame, e.g., by mold compound, insulation, glue, insulation foil, etc. Press-fit connectors may be connected to the gate contact structure and partially overmolded to prove external gate connections.

The molded power semiconductor package with the connection frame described herein may have a stray inductance of 7 nH or less, a mostly symmetrical contact structure for multiple power semiconductor dies with low gate inductance, and high symmetry between the high-side switch and low-side switch of a half bridge. The molded power semiconductor package may include four or more power SiC dies (chips) to enable high power applications for up to 1200V or more and up to 580 A or more.

Described next, with reference to the figures, are exemplary embodiments of the molded power semiconductor package and methods of producing such a power semiconductor package. Any of the connection frame and molded power semiconductor package embodiments described herein may be used interchangeably unless otherwise expressly stated.

Figure 1:
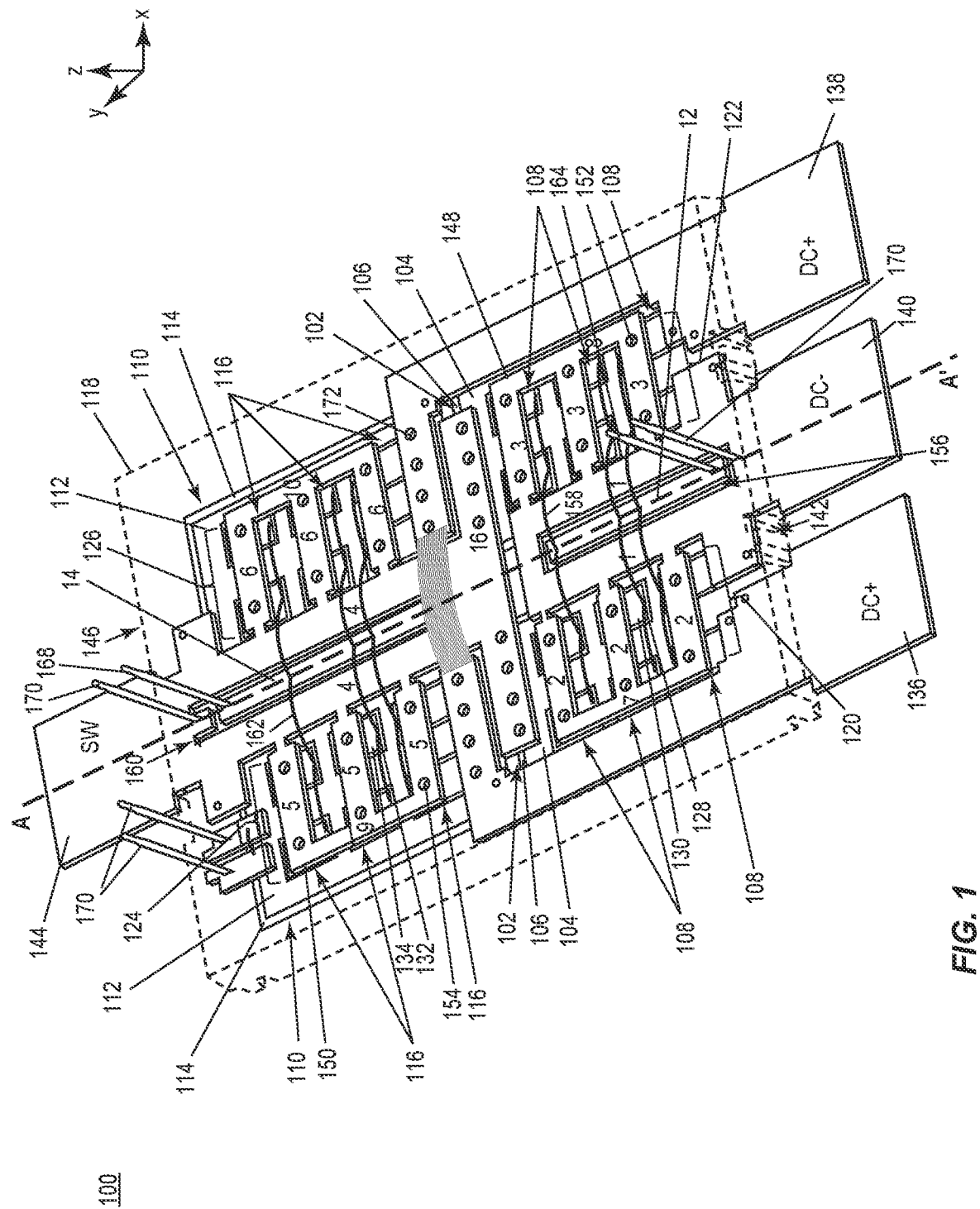
FIG. 1 illustrates a top perspective view of an embodiment of a molded power semiconductor package having a connection frame.

FIG. 1 illustrates a top perspective view of an embodiment of a molded power semiconductor package 100. The molded power semiconductor package 100 may form part of a power electronics circuit for use in various power applications such as in a DC/AC inverter, a DC/DC converter, an AC/DC converter, a DC/AC converter, an AC/AC converter, a multi-phase inverter, an H-bridge, etc.

The molded power semiconductor package 100 includes at least one first power electronics carrier 102 having a metallization layer 104 disposed on an electrically insulating substrate 106. First power semiconductor dies 108 are attached to the metallization layer 104 of the at least one first power electronics carrier 102. The molded power semiconductor package 100 also includes at least one second power electronics carrier 110 having a metallization layer 112 disposed on an electrically insulating substrate 114. Second power semiconductor dies 116 are attached to the metallization layer 112 of the at least one second power electronics carrier 110. A mold compound 118 encases the first power semiconductor dies 108 and the second power semiconductor dies 116, and at least partly encases the at least one first power electronics carrier 102 and the at least one second power electronics carrier 110. In one embodiment, the surface (out of view in FIG. 1) of the first and second power electronics carriers 102, 110 opposite the respective metallization layers 104, 112 is exposed from the mold compound 118 to provided single-sided cooling of the molded power semiconductor package 100.

The outline of the mold compound 118 is shown in FIG. 1 to provide an unobstructed view of the elements encased by the mold compound 118. The at least one first power electronics carrier 102 and the at least one second power electronics carrier 110 are positioned aside one another in the x-y plane instead of being vertically stacked one on top of the other in the z direction.

Each at least one first power electronic carrier 102 and each at least one second power electronics carrier 110 may be, e.g., a DCB (direct copper bonded) substrate, an AMB (active metal brazed) substrate, an IMS (insulated metal substrate), etc. The first power semiconductor dies 108 and the second power semiconductor dies 116 may be power Si or SiC power MOSFET (metal-oxide-semiconductor field-effect transistor) dies, HEMT (high-electron mobility transistor) dies, IGBT (insulated-gate bipolar transistor) dies, JFET (junction filed-effect transistor) dies, etc.

As shown in FIG. 1, the first power semiconductor dies 108 and the second power semiconductor dies 116 are vertical power transistor dies. For a vertical power transistor die, the primary current flow path is between the front and back sides of the die. The drain terminal is typically disposed at the backside of the die, with the gate and source terminals (and optionally one or more sense terminals) at the frontside of the die 110. Additional types of semiconductor dies may be included in the molded power semiconductor package 100, such as power diode dies, logic dies, controller dies, gate driver dies, etc.

The first power semiconductor dies 108 may be attached to the metallization layer 104 of a single first power electronics carrier 102, with a first subset 120 and a second subset 122 of the first power semiconductor dies 108 being symmetrically arranged on the single first power electronics carrier 102 about a longitudinal centerline A-A' of the molded power semiconductor package 100. The second power semiconductor dies 116 similarly may be attached to the metallization layer 112 of a single second power electronics carrier 110, with a first subset 124 and a second subset 126 of the second power semiconductor dies 116 also being symmetrically arranged on the single second power electronics carrier 110 about the longitudinal centerline A-A' of the molded power semiconductor package 100.

The first and second subsets 120, 122 of the first power semiconductor dies 108 instead may be attached to separate first power electronics carriers 102 as shown in FIG. 1, with the separate first power electronics carriers 108 being arranged symmetrically with respect to one another about the longitudinal centerline A-A' of the molded power semiconductor package 100. The first and second subsets 124, 126 of the second power semiconductor dies 116 similarly may be attached to separate second power electronics carriers 110, with the separate second power electronics carriers 110 also being arranged symmetrically with respect to one another about the longitudinal centerline A-A' of the molded power semiconductor package 100.

In the example illustrated in FIG. 1, the first power semiconductor dies 108 are arranged symmetrically about the package longitudinal centerline A-A' in three rows (x-direction) with four (two on each side of the longitudinal centerline A-A') first power semiconductor dies 108 in each row. The second power semiconductor dies 116 are also arranged symmetrically about the package longitudinal centerline A-A' in three rows (x-direction) with four (two on each side of the longitudinal centerline A-A') second power semiconductor dies 116 in each row. More generally, the molded power semiconductor package 100 may include at least two first power semiconductor dies 108 and at least two second power semiconductor dies 116, with an equal number of first power semiconductor dies 108 and an equal number of second power semiconductor dies 116 being arranged on both sides of the longitudinal centerline A-A' of the package 100. This ensures a symmetric layout of both the power semiconductor dies 108, 116 and the power electronics carriers 102, 110 within the molded body 118 of the package 100.

The first power semiconductor dies 108 and the second power semiconductor dies 116 may be electrically coupled as a half bridge, with the first power semiconductor dies 108 forming a low-side switch of the half bridge and the second power semiconductor dies 116 forming a high-side switch of the half bridge. For the vertical die arrangement shown in FIG. 1, the drain terminal (out of view in FIG. 1) of each first power semiconductor die 108 is connected to the metallization layer 104 of the at least one first power electronics carrier 102 with gate and source terminals 128, 130 (and optionally one or more sense terminals) at the opposite frontside of the first dies 108. The drain terminal (out of view in FIG. 1) of each second power semiconductor die 116 is similarly connected to the metallization layer 112 of the at least one second power electronics carrier 110 with gate and source terminals 132, 134 (and optionally one or more sense terminals) at the opposite frontside of the second dies 116.

At least one lead 136, 138, 140 protrudes from a first side face 142 of the mold compound 118 and at least one lead 144 protrudes from a second side face 146 of the mold compound 118 opposite the first side face 142. The longitudinal centerline A-A' of the molded power semiconductor package 100 extends between the first and second side faces 142, 146 of the mold compound 118.

In FIG. 1, two high-side phase or power leads 136, 138 protrude from the first side face 142 of the mold compound 118 to provide a power/phase connection 'DC+' to the second (high-side) power semiconductor dies 116. The first high-side phase/power lead 136 provides the DC+ power/phase connection to the first subset 124 of the second power semiconductor dies 116 and the second high-side phase/power lead 138 provides the DC+ power/phase connection to the second subset 126 of the second power semiconductor dies 116. A low high-side phase/ground lead 140 also protrudes from the first side face 142 of the mold compound 118 and provides a power/phase connection 'DC−' to the first (low-side) power semiconductor dies 108. The low-side phase/ground lead 140 is interposed between the first and second high-side phase/power leads 136, 138.

A switch node lead 144 protrudes from the second side face 146 of the mold compound 118 and is electrically connected to the switch node 'SW' between the high-side power semiconductor dies 116 and the low-side power semiconductor dies 108 of the half bridge. In this case, the switch node lead 144 is the output lead for the molded power semiconductor package 100.

The internal electrical connections between the package leads 136, 138, 140, 144 and the power semiconductor dies 108, 116 encased in the mold compound 118 may be provided by a connection frame overlying the power semiconductor dies 108, 116. In FIG. 1, the connection frame includes a first structured metal frame 148 disposed above the at least one first power electronics carrier 102 and a second structured metal frame 150 disposed above the at least one second power electronics carrier 110. The first structured metal frame 148 and the second structured metal frame 150 may be part of a lead frame with the features of the structured metal frames 148, 150 being formed by stamping, punching, etching, etc.

In FIG. 1, both the first structured metal frame 148 and the second structured metal frame 150 are symmetric about the longitudinal centerline A-A' of the molded power semiconductor package 100. The terms 'symmetric' and 'symmetrical' as used herein include unavoidable asymmetry which may arise due to manufacturing tolerances. However, asymmetry may be intentionally introduced into the connection frame formed by the first structured metal frame 148 and the second structured metal frame 150. For example, all semiconductor dies 108, 116 may face the same direction which can introduce a minor asymmetry in the connection frame relative to the center line A-A' of the molded power semiconductor package 100.

In either case, the first structured metal frame 148 is electrically connected to the source terminal 130 of each first (low-side) power semiconductor die 108, e.g., by bumps or stamped features 152 at the backside of the first structured metal frame 148, or by solder, electrically conductive adhesive, etc. The second structured metal frame 150 is electrically connected to the source terminal 134 of each second (high-side) power semiconductor die 116, e.g., by bumps or stamped features 154 at the backside of the second structured metal frame 150, or by solder, electrically conductive adhesive, etc.

A first subset 120 and a second subset 122 of the first power semiconductor dies 108 may be arranged on opposite sides of the longitudinal centerline A-A' of the molded power semiconductor package 100, as previously described herein. A first subset 124 and a second subset 126 of the second power semiconductor dies 116 similarly may be arranged on opposite sides of the longitudinal centerline A-A'.

As shown in FIG. 1, the first structured metal frame 148 may include a first central part '1' that extends along the longitudinal centerline A-A'. First branches '2' each joined at a proximal end to the first central part '1' extend in parallel over the first subset 120 of first power semiconductor dies 108 in a first lateral direction (−x direction in FIG. 1) that is transverse to the longitudinal centerline A-A'. Second branches '3' each joined at a proximal end to the first central part '1' extend in parallel over the second subset 122 of first power semiconductor dies 116 in a second lateral direction (x direction in FIG. 1) opposite the first lateral direction.

Further as shown in FIG. 1, the second structured metal frame 150 includes a second central part '4' that extends along the longitudinal centerline A-A'. Third branches '5' each joined at a proximal end to the second central part '4' extend in parallel over the first subset 124 of second power semiconductor dies 116 in the first lateral direction. Fourth branches '6' each joined at a proximal end to the second central part '4' extend in parallel over the second subset 126 of second power semiconductor dies 116 in the second lateral direction.

The first branches '2' of the connection frame are vertically connected to the source terminal 130 of each power semiconductor die 108 included in the first subset 120 of first power semiconductor dies 108. The second branches '3' of the connection frame are vertically connected to the source terminal 130 of each power semiconductor die 108 included in the second subset 122 of first power semiconductor dies 108. The third branches '5' of the connection frame are vertically connected to the source terminal 134 of each power semiconductor die 116 included in the first subset 124 of second power semiconductor dies 116. The fourth branches '6' of the connection frame are vertically connected to the source terminal 134 of each power semiconductor die 116 included in the second subset 126 of second power semiconductor dies 116.

The first structured metal frame 148 of the connection frame may include a first additional '7' branch that connects the first branches '2' at a distal end of the first branches '2', and a second additional branch '8' that connects the second branches '3' at a distal end of the second branches '3'. The second structured metal frame 150 of the connection frame may include a third additional branch '9' that connects the third branches '5' at a distal end of the third branches '5', and a fourth additional branch '10' that connects the fourth branches '6' at a distal end of the fourth branches '6'.

The first structured metal frame 148 of the connection frame may include a first gate metallization '12' disposed in an opening 156 formed in the first central part '1' of the first structured metal frame 148 and that is electrically insulated from the first central part '1', the first branches '2', and the second branches '3'. The first gate metallization '12' is electrically connected to the gate terminal 128 of each first power semiconductor die 108, e.g., by bond wires 158. The second structured metal frame 150 of the connection frame may include a second gate metallization '14' disposed in an opening 160 formed in the second central part '4' of the second structured metal frame 150 and that is electrically insulated from the second central part '4', the third branches '5', and the fourth branches '6'. The second gate metallization '14' is electrically connected to the gate terminal 132 of each second power semiconductor die 118, e.g., by bond wires 162.

The first and second gate metallizations '12', '14' may be part of a lead frame, as explained above. The first and second gate metallizations '12', '14' instead may be part of respective first and second PCB disposed in the corresponding openings 156, 160 formed in the first central part '1' and the second central part '4' of the connection frame. In yet another example, the first and second gate metallizations '12', '14' may be part of respective first and second additional power electronics carriers disposed in the corresponding openings 156, 160 formed in the first central part '1' and the second central part '4' of the connection frame.

A first press-fit pin 164 may be attached to the first gate metallization '12' and protrude through the front (top) surface of the mold compound 118. A second press-fit pin 168 may be attached to the second gate metallization '14' and protrude through the front surface of the mold compound 118. The molded power semiconductor package 100 may include additional press-fit pins 170 one or more of which may be attached to the first structured metal frame 148 and/or the second structured metal frame 150 and protruding through the front (top) surface of the mold compound 118, e.g., for external current sensing, temperature sensing, etc.

The second structured metal frame 150 of the connection frame may include an additional branch '16' at the end of the second central part '4' of the second structured metal frame 150 and that faces the first structured metal frame 148. The additional branch '16' extends in parallel with both the third branches '5' and the fourth branches '6' of the second structured metal frame 150. The additional branch '16' is vertically connected to the metallization layer 104 of the at least one first power electronics carrier 102, e.g., by bumps or stamped features 172 at the backside of additional branch '16', or by solder, electrically conductive adhesive, etc.

In FIG. 1, the metallization layer 104 of the least one first power electronics carrier 102 is electrically connected to the drain terminal (out of view) of each first power semiconductor die 108. The metallization layer 112 of the least one second power electronics carrier 110 is electrically connected to the drain terminal (out of view) of each second power semiconductor die 116. The first structured metal frame 148 is electrically connected to the source terminal 130 of each first power semiconductor die 108. The second structured metal frame 150 is electrically connected to the source terminal 134 of each second power semiconductor die 116. The additional branch '16' of the second structured metal frame 150 forms the switch node connection 'SW' between the drain terminal of each first power semiconductor die 108 and the source terminal 134 of each second power semiconductor die 116.

In FIG. 1, the first high-side phase/power lead 136 and the second high-side phase/power lead 138 are both electrically connected to the metallization layer 112 of the at least one second power electronics carrier 110. The first high-side phase/power lead 136 flanks one side of the first structured metal frame 148 and the second high-side phase/power lead 138 flanks the opposite side of the first structured metal frame 148 as the first high-side phase/power lead 136.

An end of the first structured metal frame 148 may protrudes from the first side face 142 of the mold compound 118 to form the low high-side phase/ground lead 140 of the molded power semiconductor package 100. An end of the second structured metal frame 150 may protrude from the second side face 146 of the mold compound 118 to form the switch node lead 144 of the molded power semiconductor package 100.

Figure 2:
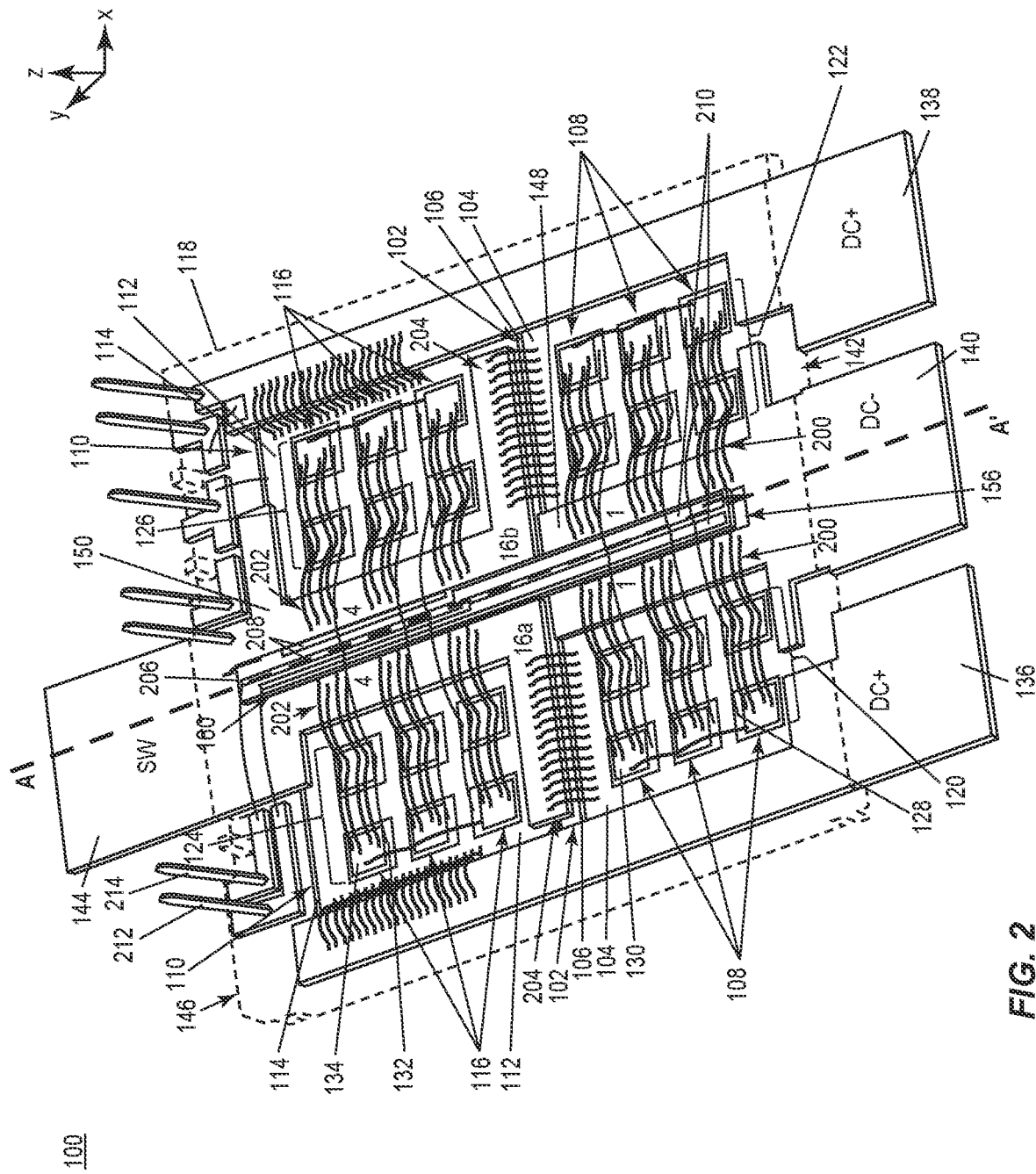
FIG. 2 illustrates a top perspective view of another embodiment of the molded power semiconductor package.

FIG. 2 illustrates a top perspective view of another embodiment of the molded power semiconductor package 100. According to the embodiment in FIG. 2, the source connections to the first power semiconductor dies 108 are formed by first bond wires 200 which connect the first central part '1' of the first structured metal frame 148 to the source terminal 130 of each first power semiconductor die 108. The source connections to the second power semiconductor dies 116 are similarly formed by second bond wires 202 which connect the second central part '4' of the second structured metal frame 150 to the source terminal 134 of each second power semiconductor die 116. Accordingly, branches '2', '3', '7' and '8' of the first structured metal frame 148 and branches '5', '6', '9' and '10' of the second structured metal frame 150 are omitted from the connection frame and replaced by bond wires 200, 202 in FIG. 2. The additional branch '16' of the second structured metal frame 150 is electrically connected to the metallization layer 104 of the at least one first power electronics carrier 102 by third bond wires 204 in FIG. 2 to complete the switch node connection 'SW'.

In FIG. 2, the gate connections to the power semiconductor dies 108, 116 are provided by at least one PCB 206 disposed in the opening 156 formed in the first central part '1' of the first structured metal frame 148 and in the opening 160 formed in the second central part '4' of the second structured metal frame 150. The at least one PCB 206 has one or more first metal traces 208 electrically connected to the gate terminal 128 of each first power semiconductor die 108 and one or more second metal traces 210 electrically connected to the gate terminal 132 of each second power semiconductor die 116. The external gate connections may be provided by respective press-fit connectors 212, 214. The at least one PCB 206 may instead by at least one additional power electronics carrier such as a DCB substrate, an AMB substrate, an IMS, etc.

In FIG. 2, the first structured metal frame 148 is wire bonded to the source terminal 130 of each first power semiconductor die 108 and the second structured metal frame 150 is wire bonded to the source terminal 134 of each second power semiconductor die 116. The additional branch '16' of the second structured metal frame 150 may be divided into two segments '16a', '16b' to accommodate the at least one PCB/power electronics carrier 206 that provides the gate connections to the power semiconductor dies 108, 116. Each segment '16a', '16b' of the additional branch '16' of the second structured metal frame 150 is wire bonded to the metallization layer 104 of a first power electronics carrier 102 to form the switch node connection 'SW' between the drain terminal (out of view) of each first power semiconductor die 108 and the source terminal 134 of each second power semiconductor die 116.

Figure 3:
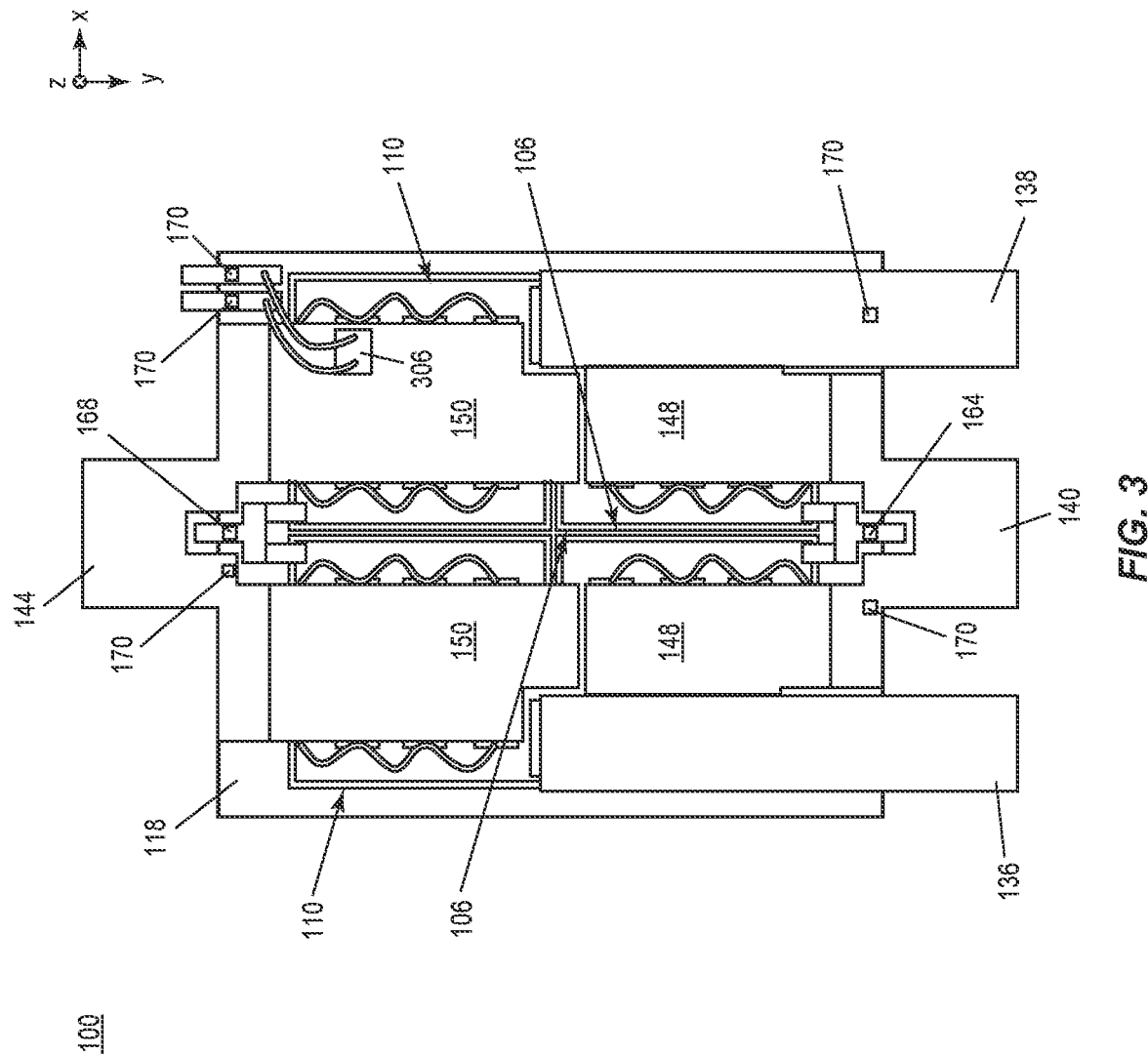
FIG. 3 illustrates a top plan view of another embodiment of the molded power semiconductor package.

FIG. 3 illustrates a top plan view of another embodiment of the molded power semiconductor package 100. The mold compound 118 is only shown around the edge of the package 100, to provide an unobstructed view of the elements encased by the mold compound 118.

In FIG. 3, the two high-side phase or power leads 136, 138 are each thicker than both the first structured metal frame 148 and the second structured metal frame 150. The low high-side phase/ground lead 140 for the half bridge, which is laterally interposed between the high-side phase or power leads 136, 138, is vertically connected to the first structured metal frame 148 and thicker than both the first structured metal frame 148 and the second structured metal frame 150. The switch node lead 144 for the half bridge is vertically connected to the second structured metal frame 150 and thicker than both the first structured metal frame 148 and the second structured metal frame 150. The first and second structured metal frames 148, 150 are made thinner than the package leads 136, 138, 140, 144 in FIG. 2 to reduce stray inductance.

FIGS. 4A and 4B illustrate top plan views of an embodiment of producing the connection frame with different thicknesses.

FIG. 4A shows the first structured metal frame 148 and the second structured metal frame 150. The first structured metal frame 148 and the second structured metal frame 150 may be part of a first lead frame 300 with the features of the structured metal frames 148, 150 being formed by stamping, punching, etching, etc.

FIG. 4B shows a second lead frame 302 overlying and attached to the first lead frame 300. The first and second lead frames 300, 302 may be soldered or welded together, e.g., to form a multi-layer lead frame 304 that may be processed further as a single lead frame. The second lead frame 302 includes the package leads 136, 138, 140, 144 and additional metal structures some of which may be electrically connected to a sensor 306 such as an NTC (negative temperature coefficient) temperature sensor, e.g., as shown in FIG. 3. The metal structures of the second lead frame 302 may be formed by stamping, punching, etching, etc. The second lead frame 302 is thicker than the first lead frame 300, which allows additional routing and provides the leads 136, 138, 140, 144 outside the molded body 118.

For example, the first lead frame 300, which includes the first and second structured metal frames 148, 150, may have a thickness less than 0.5 mm, e.g., of about 0.25 mm. The second lead frame 302, which includes the package leads 136, 138, 140, 144, may have a thickness greater than 0.5 mm and less than 1 mm, e.g., of about 0.8 mm. Other lead frame thickness combinations may be used, with the second lead frame 302 being thicker than the first lead frame 300. The multi-layer lead frame 304 is then attached to the power electronics carriers 102, 110 and the power semiconductor dies 108, 116, as previously described herein and as shown in FIG. 3.

Figure 5B:
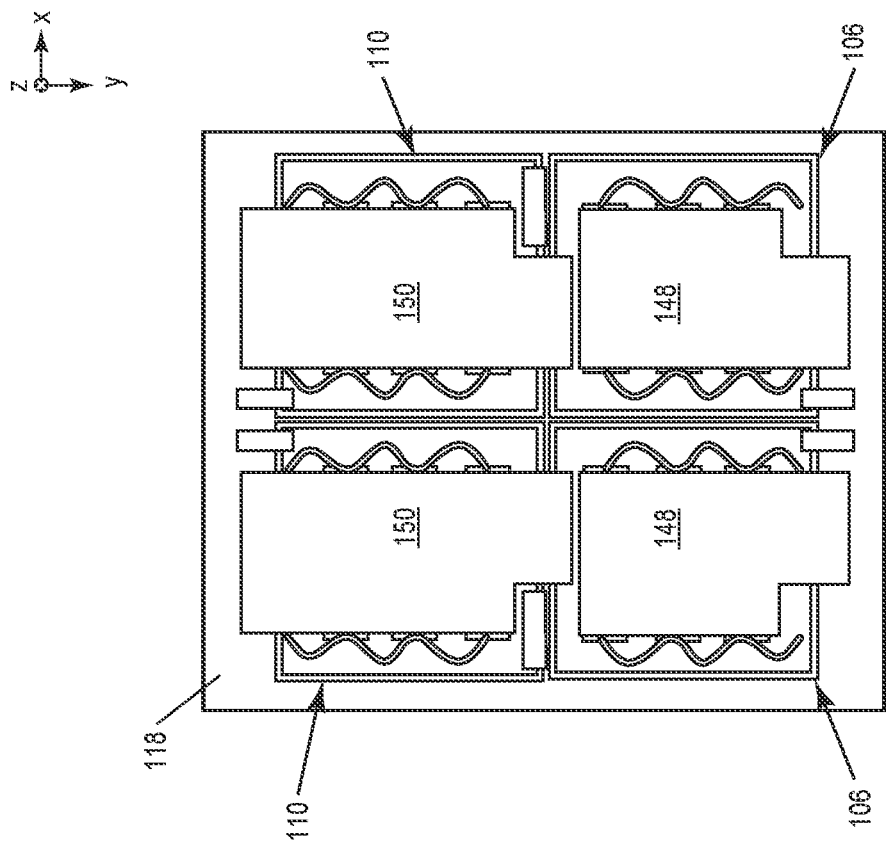
FIGS. 5A and 5B illustrate top plan views of another embodiment of producing the connection frame with different thicknesses.
Figure 5A:
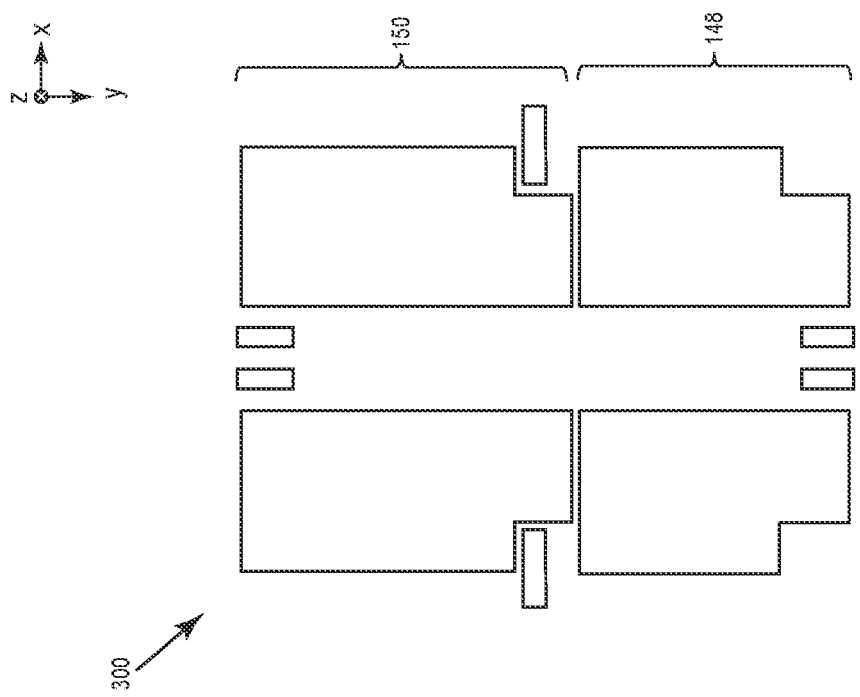

FIGS. 5A and 5B illustrate top plan views of another embodiment of producing the connection frame with different thicknesses.

FIG. 5A shows the first structured metal frame 148 and the second structured metal frame 150. The first structured metal frame 148 and the second structured metal frame 150 may be part of a first lead frame 300 with the features of the structured metal frames 148, 150 being formed by stamping, punching, etching, etc.

FIG. 5B shows the first lead frame 300 attached to the source terminals 128, 132 of the power semiconductor dies 108, 116 as previously described herein in connection with FIG. 1. Different than the embodiment illustrated in FIGS. 4A and 4B, the first lead frame 300 is attached to the source terminals 128, 132 of the power semiconductor dies 108, 116 in FIG. 5A before attaching the second lead frame 302 to the first lead frame 300. After the first lead frame 300 is attached to the source terminals 128, 132 of the power semiconductor dies 108, the second lead frame 302 is attached to the first lead frame 300, e.g., by soldering, welding, etc. to yield the structure shown in FIG. 3.

Figure 6A:
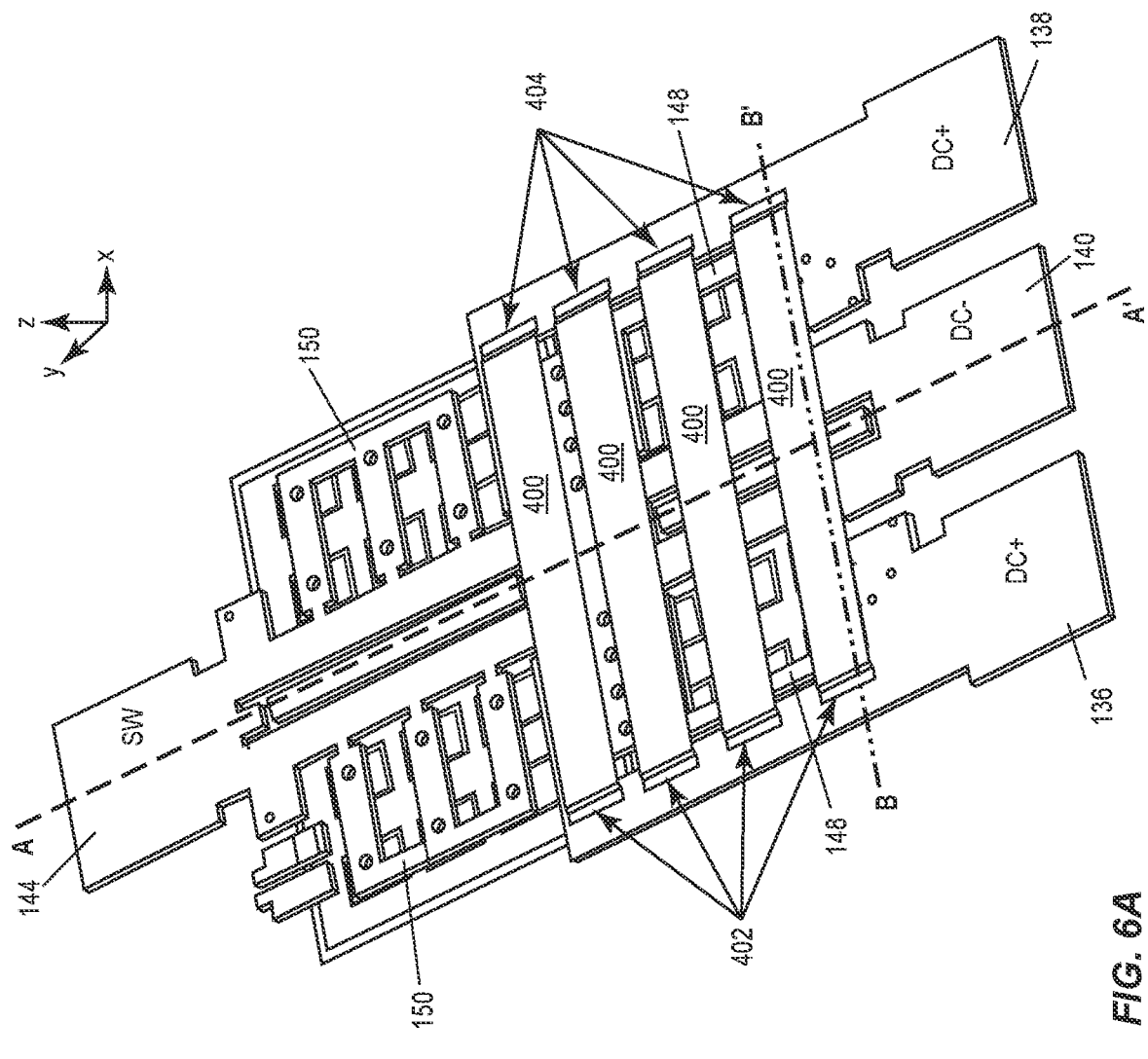
FIG. 6A illustrates a top perspective view of another embodiment of the molded power semiconductor package.
Figure 6B:
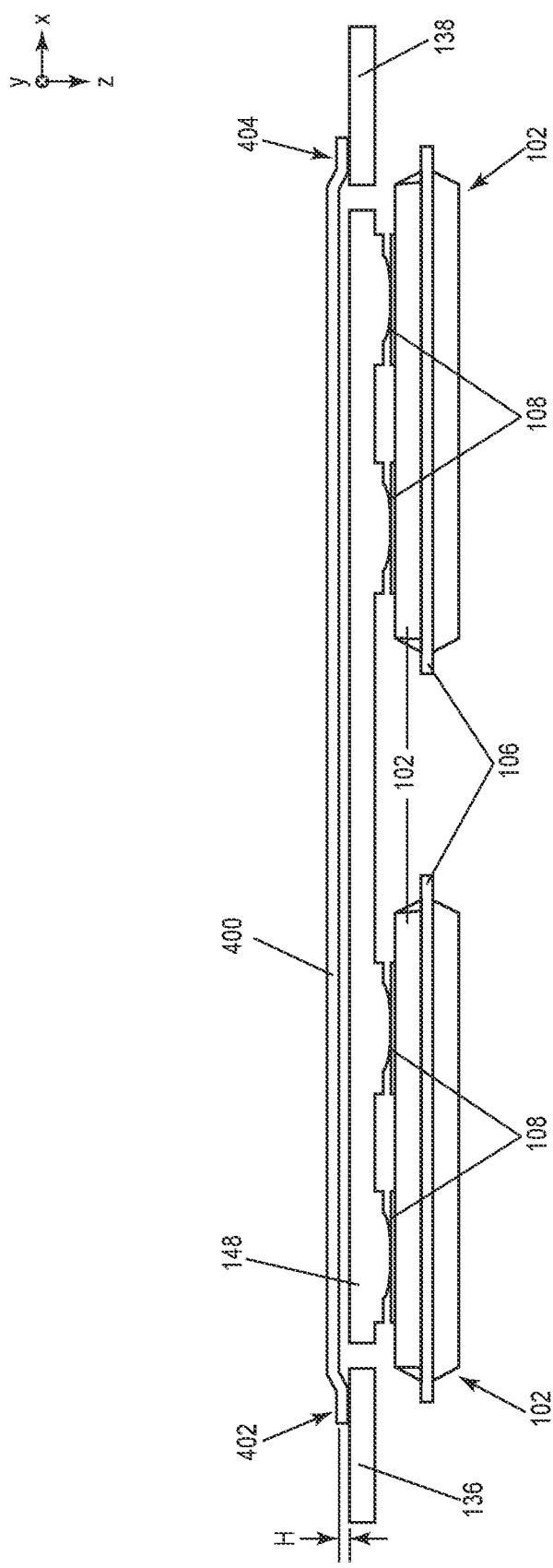
FIG. 6B is a cross-sectional view of the molded power semiconductor package along the line labelled B-B' in FIG. 6A.

FIGS. 6A and 6B illustrate another embodiment of the molded power semiconductor package 100. FIG. 6A is a top perspective view of the molded power semiconductor package 100. FIG. 6B is a cross-sectional view of the molded power semiconductor package 100 along the line labelled B-B' in FIG. 6A. The mold compound 118 is not shown in FIGS. 6A and 6B, to provide an unobstructed view of the elements encased by the mold compound 118.

FIG. 6A shows the same carrier, die, and connection frame layout as FIG. 1. Accordingly, most of the reference numbers are omitted from FIG. 6A to provide a clearer view of the additional features first illustrated in FIG. 6A.

In FIG. 6A, metal strips or a single metal sheet 400 are connected at a first end 402 to the first high-side phase/power lead 136 and at a second end 404 to the second high-side phase/power lead 138. The metal strips or single metal sheet 400 span the first structured metal frame 148, as shown in FIG. 6B. In the case of metal strips, Cu ribbons or Al ribbons may be connected to the high-side phase/power leads 136, 138 by a ribbon-bonding process such as ultrasonic welding or laser-assisted ultrasonic welding. In the case of a single metal sheet, a Cu or Al sheet may be soldered to the high-side phase/power leads 136, 138.

Placing the metal strips or a single metal sheet 400 over the power contacts inside of the molded power semiconductor package 100 reduces the stray inductance by about 28%, e.g., from about 9.1 nH for the embodiment in FIG. 1 to about 6.6 nH for the embodiment in FIGS. 6A and 6B, as calculated without the positive influence of a cooler. The stray inductance improvement is even greater compared to the wire bond embodiment of FIG. 2, which has a stray inductance of about 11 nH.

As shown in FIG. 6B, the metal strips or single metal sheet 400 may be placed with defined form and height 'H' over the first contact metal layer. The height 'H' may range from 50 to 1000 µm for ensuring insulation properties. The smaller the height 'H', the lower stray inductance expected. A clearance height in the range of 300 to 500 µm is typically required for standard molding compound.

Figure 7:
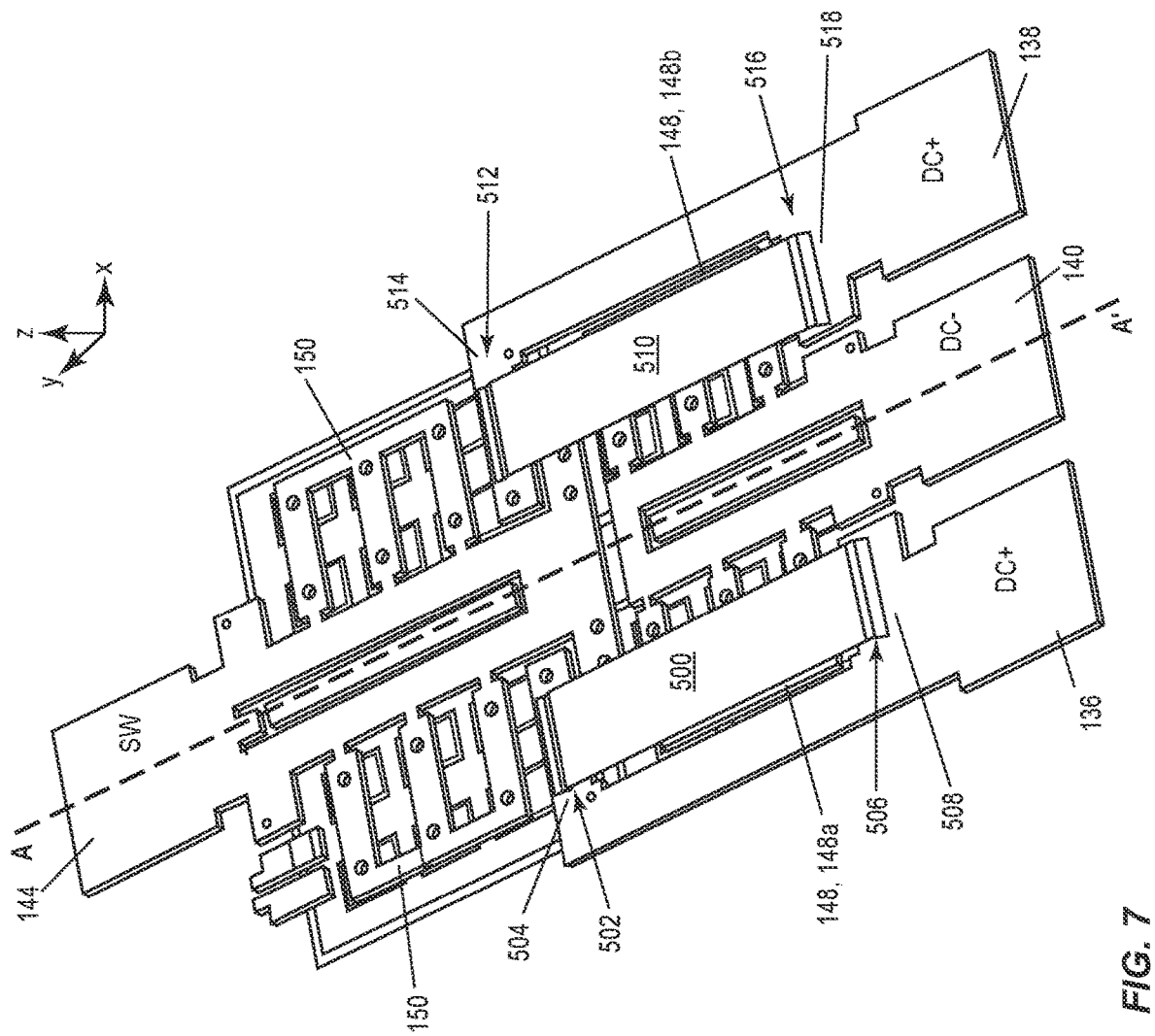
FIG. 7 illustrates a top perspective view of another embodiment of the molded power semiconductor package.

FIG. 7. illustrates a top perspective view of another embodiment of the molded power semiconductor package 100. The mold compound 118 is not shown in FIG. 7, to provide an unobstructed view of the elements encased by the mold compound 118.

In FIG. 7, a first metal strip or sheet 500 is connected at a first end 502 to a first part 504 of the first high-side phase/power lead 136 and at a second end 506 to a second end 508 of the first high-side phase/power lead 136. The first metal strip or sheet 500 spans the first structured metal frame 148 between the first part 504 and the second part 508 of the first high-side phase/power lead 136. In this embodiment, the first high-side phase/power lead 136 has a C-shape inside the molded package body and a part 148a of the first structured metal frame 148 is disposed in the open part of the C-shape. The first metal strip or sheet 500 is connected to both ends 502, 508 of the C-shape, spanning the part 148a of the first structured metal frame 148 disposed in the open part of the C-shape.

In FIG. 7, a second metal strip or sheet 510 is connected at a first end 512 to a first part 514 of the second high-side phase/power lead 138 and at a second end 516 to a second end 518 of the second high-side phase/power lead 138. The second metal strip or sheet 500 spans the first structured metal frame 148 between the first part 514 and the second part 518 of the second high-side phase/power lead 138. In this embodiment, the second high-side phase/power lead 138 has a C-shape inside the molded package body and a part 148b of the first structured metal frame 148 is disposed in the open part of the C-shape. The second metal strip or sheet 510 is connected to both ends 512, 518 of the C-shape, spanning the part 148b of the first structured metal frame 148 disposed in the open part of the C-shape. The two C-shaped parts of the high-side phase/power leads 136, 138 face one another in a symmetrical configuration about the longitudinal centerline A-A' in FIG. 7. As previously explained herein, both the first power semiconductor dies 108 and the second power semiconductor dies 116 may be equally distributed on both sides of the longitudinal centerline A-A'.

Although the present disclosure is not so limited, the following numbered examples demonstrate one or more aspects of the disclosure.

Example 1. A molded power semiconductor package, comprising: at least one first power electronics carrier comprising a metallization layer disposed on an electrically insulating substrate; a plurality of first power semiconductor dies attached to the metallization layer of the at least one first power electronics carrier; at least one second power electronics carrier comprising a metallization layer disposed on an electrically insulating substrate; a plurality of second power semiconductor dies attached to the metallization layer of the at least one second power electronics carrier; and a mold compound encasing the plurality of first power semiconductor dies and the plurality of second power semiconductor dies, and at least partly encasing the at least one first power electronics carrier and the at least one second power electronics carrier, wherein the at least one first power electronics carrier and the at least one second power electronics carrier lie in a same plane.

Example 2. The molded power semiconductor package of example 1, wherein the plurality of first power semiconductor dies is attached to the metallization layer of a single first power electronics carrier, wherein a first subset and a second subset of the plurality of first power semiconductor dies are symmetrically arranged on the single first power electronics carrier about a longitudinal centerline of the molded power semiconductor package, wherein the plurality of second power semiconductor dies is attached to the metallization layer of a single second power electronics carrier, and wherein a first subset and a second subset of the plurality of second power semiconductor dies are symmetrically arranged on the single second power electronics carrier about the longitudinal centerline of the molded power semiconductor package.

Example 3. The molded power semiconductor package of example 1, wherein first and second subsets of the plurality of first power semiconductor dies are attached to separate first power electronics carriers, wherein the separate first power electronics carriers are arranged symmetrically with respect to one another about a longitudinal centerline of the molded power semiconductor package, wherein first and second subsets of the plurality of second power semiconductor dies are attached to separate second power electronics carriers, and wherein the separate second power electronics carriers are arranged symmetrically with respect to one another about the longitudinal centerline of the molded power semiconductor package.

Example 4. The molded power semiconductor package of any of examples 1 through 3, wherein the plurality of first power semiconductor dies and the plurality of second power semiconductor dies are electrically coupled as a half bridge, wherein the plurality of first power semiconductor dies forms a low-side switch device of the half bridge, and wherein the plurality of second power semiconductor dies forms a high-side switch device of the half bridge.

Example 5. The molded power semiconductor package of any of examples 1 through 4, further comprising: at least one lead protruding from a first side face of the mold compound; at least one lead protruding from a second side face of the mold compound opposite the first side face, wherein a longitudinal centerline of the molded power semiconductor package extends between the first side face and the second side face of the mold compound.

Example 6. The molded power semiconductor package of any of examples 1 through 5, further comprising: a first structured metal frame disposed above the at least one first power electronics carrier and electrically connected to a load terminal of each power semiconductor die of the plurality of first power semiconductor dies; and a second structured metal frame disposed above the at least one second power electronics carrier and electrically connected to a load terminal of each power semiconductor die of the plurality of second power semiconductor dies.

Example 7. The molded power semiconductor package of example 6, wherein: a first subset and a second subset of the plurality of first power semiconductor dies are arranged on opposite sides of a longitudinal centerline of the molded power semiconductor package; a first subset and a second subset of the plurality of second power semiconductor dies are arranged on the opposite sides of the longitudinal centerline; the first structured metal frame comprises a first central part that extends along the longitudinal centerline, first branches each joined at a proximal end to the first central part and extending in parallel over the first subset of the plurality of first power semiconductor dies in a first lateral direction that is transverse to the longitudinal centerline, and second branches each joined at a proximal end to the first central part and extending in parallel over the second subset of the plurality of first power semiconductor dies in a second lateral direction opposite the first lateral direction; and the second structured metal frame comprises a second central part that extends along the longitudinal centerline, third branches each joined at a proximal end to the second central part and extending in parallel over the first subset of the plurality of second power semiconductor dies in the first lateral direction, and fourth branches each joined at a proximal end to the second central part and extending in parallel over the second subset of the plurality of second power semiconductor dies in the second lateral direction.

Example 8. The molded power semiconductor package of example 7, wherein: the first branches are vertically connected to a load terminal of each power semiconductor die included in the first subset of the plurality of first power semiconductor dies; the second branches are vertically connected to a load terminal of each power semiconductor die included in the second subset of the plurality of first power semiconductor dies; the third branches are vertically connected to a load terminal of each power semiconductor die included in the first subset of the plurality of second power semiconductor dies; and the fourth branches are vertically connected to a load terminal of each power semiconductor die included in the second subset of the plurality of second power semiconductor dies.

Example 9. The molded power semiconductor package of example 7 or 8, wherein: the first structured metal frame comprises a first additional branch that connects the first branches at a distal end of the first branches, and a second additional branch that connects the second branches at a distal end of the second branches; and the second structured metal frame comprises a third additional branch that connects the third branches at a distal end of the third branches, and a fourth additional branch that connects the fourth branches at a distal end of the fourth branches.

Example 10. The molded power semiconductor package of any of examples 7 through 9, wherein: the first structured metal frame comprises a first gate metallization disposed in an opening formed in the first central part and that is electrically insulated from the first central part, the first branches, and the second branches; the first gate metallization is electrically connected to a gate terminal of each power semiconductor die included in the plurality of first power semiconductor dies; the second structured metal frame comprises a second gate metallization disposed in an opening formed in the second central part and that is electrically insulated from the second central part, the third branches, and the fourth branches; and the second gate metallization is electrically connected to a gate terminal of each power semiconductor die included in the plurality of second power semiconductor dies.

Example 11. The molded power semiconductor package of example 10, further comprising: a first press-fit pin attached to the first gate metallization and protruding through a front surface of the mold compound, the mold compound also having a back surface opposite the front surface and side faces extending between the front and back surfaces; and a second press-fit pin attached to the second gate metallization and protruding through the front surface of the mold compound.

Example 12. The molded power semiconductor package of any of examples 7 through 11, further comprising: at least one printed circuit board (PCB) disposed in an opening formed in the first central part and in an opening formed in the second central part, wherein the at least one PCB has one or more first metal traces electrically connected to a gate terminal of each power semiconductor die included in the plurality of first power semiconductor dies and one or more second metal traces electrically connected to a gate terminal of each power semiconductor die included in the plurality of second power semiconductor dies.

Example 13. The molded power semiconductor package of any of examples 7 through 12, further comprising: a first additional power electronics carrier disposed in an opening formed in the first central part and having a gate metallization electrically connected to a gate terminal of each power semiconductor die included in the plurality of first power semiconductor dies; and a second additional power electronics carrier disposed in an opening formed in the second central part and having a gate metallization electrically connected to a gate terminal of each power semiconductor die included in the plurality of second power semiconductor dies.

Example 14. The molded power semiconductor package of example 7, wherein: the second structured metal frame comprises an additional branch at an end of the second central part that faces the first structured metal frame; the additional branch extends in parallel with both the third branches and the fourth branches; the additional branch is vertically connected to the metallization layer of the at least one first power electronics carrier.

Example 15. The molded power semiconductor package of example 14, wherein: the metallization layer of the least one first power electronics carrier is electrically connected to a drain terminal of each power semiconductor die of the plurality of first power semiconductor dies; the metallization layer of the least one second power electronics carrier is electrically connected to a drain terminal of each power semiconductor die of the plurality of second power semiconductor dies; the first structured metal frame is electrically connected to a source terminal of each power semiconductor die of the plurality of first power semiconductor dies; the second structured metal frame is electrically connected to a source terminal of each power semiconductor die of the plurality of second power semiconductor dies; and the additional branch of the second structured metal frame forms a switch node connection between the drain terminal of each power semiconductor die of the plurality of first power semiconductor dies and the source terminal of each power semiconductor die of the plurality of second power semiconductor dies.

Example 16. The molded power semiconductor package of any of examples 6 through 15, wherein: a first subset and a second subset of the plurality of first power semiconductor dies are arranged on opposite sides of a longitudinal centerline of the molded power semiconductor package; a first subset and a second subset of the plurality of second power semiconductor dies are arranged on the opposite sides of the longitudinal centerline of the molded power semiconductor package; the first structured metal frame comprises a first central part that is wire bonded to a load terminal of each power semiconductor die included in the first power semiconductor dies; and the second structured metal frame comprises a second central part that is wire bonded to a load terminal of each power semiconductor die included in the second power semiconductor dies.

Example 17. The molded power semiconductor package of example 16, further comprising: a printed circuit board (PCB) disposed in an opening formed in the first central part and in the second central part, the PCB has one or more first metal traces electrically connected to a gate terminal of each power semiconductor die included in the plurality of first power semiconductor dies; and the PCB has one or more second metal traces electrically connected to a gate terminal of each power semiconductor die included in the plurality of second power semiconductor dies.

Example 18. The molded power semiconductor package of example 16 or 17, further comprising: an additional power electronics carrier disposed in an opening formed in the first central part and in the second central part; the additional power electronics carrier has a first gate metallization electrically connected to a gate terminal of each power semiconductor die included in the plurality of first power semiconductor dies; and the additional power electronics carrier has a second gate metallization electrically connected to a gate terminal of each power semiconductor die included in the plurality of second power semiconductor dies.

Example 19. The molded power semiconductor package of any of examples 16 through 18, wherein: the second structured metal frame comprises at least one branch at an end of the second central part that faces the first structured metal frame; and the at least one branch is wire bonded to the metallization layer of the at least one first power electronics carrier.

Example 20. The molded power semiconductor package of example 19, wherein: the metallization layer of the least one first power electronics carrier is electrically connected to a drain terminal of each power semiconductor die of the plurality of first power semiconductor dies; the metallization layer of the least one second power electronics carrier is electrically connected to a drain terminal of each power semiconductor die of the plurality of second power semiconductor dies; the first structured metal frame is wire bonded to a source terminal of each power semiconductor die of the plurality of first power semiconductor dies; the second structured metal frame is wire bonded to a source terminal of each power semiconductor die of the plurality of second power semiconductor dies; and the at least one branch of the second structured metal frame forms a switch node connection between the drain terminal of each power semiconductor die of the plurality of first power semiconductor dies and the source terminal of each power semiconductor die of the plurality of second power semiconductor dies.

Example 21. The molded power semiconductor package of any of examples 6 through 20, further comprising: a first power lead electrically connected to the metallization layer of the at least one second power electronics carrier and protruding from a first side face of the mold compound; a second power lead electrically connected to the metallization layer of the at least one second power electronics carrier and protruding from the first side face of the mold compound, wherein the first power lead flanks a first side of the first structured metal frame, wherein the second power lead flanks a second side of the first structured metal frame opposite the first side.

Example 22. The molded power semiconductor package of example 21, wherein an end of the first structured metal frame protrudes from the first side face of the mold compound to form a ground lead.

Example 23. The molded power semiconductor package of example 21 or 22, wherein an end of the second structured metal frame protrudes from a second side face of the mold compound opposite the first side face to form a switch node lead.

Example 24. The molded power semiconductor package of any of examples 21 through 23, further comprising: a first press-fit pin attached to the first structured metal frame and protruding through a front surface of the mold compound, the mold compound also having a back surface opposite the front surface, the first and second side faces of the mold compound extending between the front and back surfaces; and a second press-fit pin attached to the second structured metal frame and protruding through the front surface of the mold compound.

Example 25. The molded power semiconductor package of any of examples 21 through 24, further comprising: a first gate metallization embedded in the mold compound above the at least one first power electronics carrier and electrically connected to a gate terminal of each power semiconductor die included in the plurality of first power semiconductor dies; a second gate metallization embedded in the mold compound above the at least one second power electronics carrier and electrically connected to a gate terminal of each power semiconductor die included in the plurality of second power semiconductor dies; a first press-fit pin attached to the first gate metallization and protruding through a front surface of the mold compound, the mold compound also having a back surface opposite the front surface, the first and second side faces of the mold compound extending between the front and back surfaces; and a second press-fit pin attached to the second gate metallization and protruding through the front surface of the mold compound.

Example 26. The molded power semiconductor package of any of examples 1 through 25, wherein a surface of the first and second carriers opposite the respective metallization layers is exposed from the mold compound.

Example 27. A molded power semiconductor package, comprising: a mold compound; a plurality of first power semiconductor dies embedded in the mold compound; a plurality of second power semiconductor dies embedded in the mold compound and electrically connected to the plurality of first power semiconductor dies to form a half bridge; a first structured metal frame disposed above the plurality of first power semiconductor dies and electrically connected to a load terminal of each power semiconductor die of the plurality of first power semiconductor dies; a second structured metal frame disposed above the plurality of first power semiconductor dies and electrically connected to a load terminal of each power semiconductor die of the plurality of second power semiconductor dies, wherein both the first structured metal frame and the second structured metal frame are symmetric about a longitudinal centerline of the molded power semiconductor package.

Example 28. The molded power semiconductor package of example 27, further comprising: a first power lead for the half bridge protruding from a first side face of the mold compound; a second power lead for the half bridge protruding from the first side face of the mold compound, wherein the first power lead flanks a first side of the first structured metal frame, wherein the second power lead flanks a second side of the first structured metal frame opposite the first side.

Example 29. The molded power semiconductor package of example 28, wherein an end of the first structured metal frame protrudes from the first side face of the mold compound to form a ground lead for the half bridge.

Example 30. The molded power semiconductor package of example 28 or 29, wherein an end of the second structured metal frame protrudes from a second side face of the mold compound opposite the first side face to form a switch node lead for the half bridge.

Example 31. The molded power semiconductor package of any of examples 28 through 30, further comprising: a first press-fit pin attached to the first structured metal frame and protruding through a front surface of the mold compound, the mold compound also having a back surface opposite the front surface, the first and second side faces of the mold compound extending between the front and back surfaces; and a second press-fit pin attached to the second structured metal frame and protruding through the front surface of the mold compound.

Example 32. The molded power semiconductor package of any of examples 28 through 31, further comprising: a first gate metallization embedded in the mold compound above the plurality of first power semiconductor dies and electrically connected to a gate terminal of each power semiconductor die included in the plurality of first power semiconductor dies; a second gate metallization embedded in the mold compound above the plurality of second power semiconductor dies and electrically connected to a gate terminal of each power semiconductor die included in the plurality of second power semiconductor dies; a first press-fit pin attached to the first gate metallization and protruding through a front surface of the mold compound, the mold compound also having a back surface opposite the front surface, the first and second side faces of the mold compound extending between the front and back surfaces; and a second press-fit pin attached to the second gate metallization and protruding through the front surface of the mold compound.

Example 33. The molded power semiconductor package of any of examples 28 through 32, wherein the first power lead and the second power lead are each thicker than both the first structured metal frame and the second structured metal frame.

Example 34. The molded power semiconductor package of example 33, wherein the first structured metal frame and the second structured metal frame are part of a first lead frame, wherein the first power lead and the second power lead are part of a second lead frame, wherein the second lead frame overlies and is attached to the first lead frame, and wherein the second lead frame is thicker than the first lead frame.

Example 35. The molded power semiconductor package of any of examples 28 through 34, further comprising: a ground lead for the half bridge protruding from the first side face of the mold compound and laterally interposed between the first power lead and the second power lead, wherein the ground lead is vertically connected to the first structured metal frame and thicker than both the first structured metal frame and the second structured metal frame.

Example 36. The molded power semiconductor package of any of examples 28 through 35, further comprising: a switch node lead for the half bridge protruding from a first side face of the mold compound opposite the first side face, wherein the switch node lead is vertically connected to the second structured metal frame and thicker than both the first structured metal frame and the second structured metal frame.

Example 37. The molded power semiconductor package of any of examples 28 through 36, further comprising: a plurality of metal strips or a single metal sheet connected at a first end to the first power lead and at a second end to the second power lead, wherein the plurality of metal strips or single metal sheet spans the first structured metal frame.

Example 38. The molded power semiconductor package of any of examples 28 through 36, further comprising: a first metal strip or sheet connected at a first end to a first part of the first power lead and at a second end to a second end of the first power lead; and a second metal strip or sheet connected at a first end to a first part of the second power lead and at a second end to a second end of the second power lead, wherein the first metal strip or sheet spans the first structured metal frame between the first part and the second part of the first power lead, wherein the second metal strip or sheet spans the first structured metal frame between the first part and the second part of the second power lead.

Example 39. The molded power semiconductor package of any of examples 27 through 38, wherein the plurality of first power semiconductor dies is equally distributed on both sides of the longitudinal centerline, and wherein the plurality of second power semiconductor dies is equally distributed on both sides of the longitudinal centerline.

Example 40. A molded power semiconductor package, comprising: a mold compound; a plurality of first power semiconductor dies embedded in the mold compound; a plurality of second power semiconductor dies embedded in the mold compound and electrically connected to the plurality of first power semiconductor dies to form a half bridge; a first structured metal frame disposed above the plurality of first power semiconductor dies and electrically connected to a load terminal of each power semiconductor die of the plurality of first power semiconductor dies; and a second structured metal frame disposed above the plurality of second power semiconductor dies and electrically connected to a load terminal of each power semiconductor die of the plurality of second power semiconductor dies, wherein both the first structured metal frame and the second structured metal frame are symmetric about a longitudinal centerline of the molded power semiconductor package.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor package, comprising:
    at least one first power electronics carrier;
    a plurality of first power semiconductor dies attached to a metallization layer of the at least one first power electronics carrier;
    at least one second power electronics carrier;
    a plurality of second power semiconductor dies attached to a metallization layer of the at least one second power electronics carrier;
    a first lead frame comprising a first structured metal frame disposed above the at least one first power electronics carrier and electrically connected to a load terminal of each power semiconductor die of the plurality of first power semiconductor dies, and a second structured metal frame disposed above the at least one second power electronics carrier and electrically connected to a load terminal of each power semiconductor die of the plurality of second power semiconductor dies and to the metallization layer of the at least one first power electronics carrier; and
    a second lead frame disposed above the first lead frame and comprising:
        a first lead electrically connected to the metallization layer of the at least one second power electronics carrier;
        a second lead electrically connected to the metallization layer of the at least one second power electronics carrier;
        a third lead interposed between the first and second leads and electrically connected to the first structured metal frame of the first lead frame; and
        a fourth lead electrically connected to the second structured metal frame of the first lead frame.

2. The power semiconductor package of claim 1, further comprising a mold compound encasing the plurality of first power semiconductor dies and the plurality of second power semiconductor dies, and at least partly encasing the at least one first power electronics carrier and the at least one second power electronics carrier.

3. The power semiconductor package of claim 2, wherein the first lead protrudes from a first side face of the mold compound, and wherein the second lead protrudes from the first side face of the mold compound.

4. The power semiconductor package of claim 3, wherein the third lead protrudes from the first side face of the mold compound between the first lead and the second lead.

5. The power semiconductor package of claim 3, wherein the fourth lead protrudes from a second side face of the mold compound opposite the first side face.

6. The power semiconductor package of claim 3, further comprising:
    a first press-fit pin attached to the first structured metal frame and protruding through a front surface of the mold compound, the mold compound also having a back surface opposite the front surface, the first and second side faces of the mold compound extending between the front and back surfaces; and
    a second press-fit pin attached to the second structured metal frame and protruding through the front surface of the mold compound.

7. The power semiconductor package of claim 3, further comprising:
- a first gate metallization embedded in the mold compound above the at least one first power electronics carrier and electrically connected to a gate terminal of each power semiconductor die included in the plurality of first power semiconductor dies;
- a second gate metallization embedded in the mold compound above the at least one second power electronics carrier and electrically connected to a gate terminal of each power semiconductor die included in the plurality of second power semiconductor dies;
- a first press-fit pin attached to the first gate metallization and protruding through a front surface of the mold compound, the mold compound also having a back surface opposite the front surface, the first and second side faces of the mold compound extending between the front and back surfaces; and
- a second press-fit pin attached to the second gate metallization and protruding through the front surface of the mold compound.

8. The power semiconductor package of claim 1, wherein the plurality of second power semiconductor dies and the plurality of first power semiconductor dies are electrically connected to form a half bridge.

9. The power semiconductor package of claim 8, wherein the first lead forms a first DC+ lead for the half bridge, wherein the second lead forms a second DC+ lead for the half bridge, wherein the third lead forms a DC-lead for the half bridge, and wherein the fourth lead forms a switch node lead for the half bridge.

10. The power semiconductor package of claim 1, wherein the second lead frame is thicker than the first lead frame.

11. The power semiconductor package of claim 1, wherein the first lead frame has a thickness less than 0.5 mm, and wherein the second lead frame has a thickness greater than 0.5 mm and less than 1 mm.

12. The power semiconductor package of claim 1, wherein the first lead and the second lead are each thicker than both the first structured metal frame and the second structured metal frame.

13. The power semiconductor package of claim 1, wherein the third lead is laterally interposed between the first lead and the second lead, and wherein the third lead is vertically connected to the first structured metal frame and thicker than both the first structured metal frame and the second structured metal frame.

14. The power semiconductor package of claim 1, wherein the fourth lead is vertically connected to the second structured metal frame and thicker than both the first structured metal frame and the second structured metal frame.

15. The power semiconductor package of claim 1, further comprising a sensor, and wherein the second lead frame comprises a metal structure electrically connected to the sensor.

* * * * *